(12) United States Patent
Khan et al.

(10) Patent No.: US 9,837,378 B2
(45) Date of Patent: Dec. 5, 2017

(54) FAN-OUT 3D IC INTEGRATION STRUCTURE WITHOUT SUBSTRATE AND METHOD OF MAKING THE SAME

(71) Applicant: Avago Technologies General IP (Singapore) Pte. Ltd., Singapore (SG)

(72) Inventors: Rezaur Rahman Khan, Irvine, CA (US); Sam Ziqun Zhao, Irvine, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/954,679

(22) Filed: Nov. 30, 2015

(65) Prior Publication Data

US 2017/0117251 A1    Apr. 27, 2017

Related U.S. Application Data

(60) Provisional application No. 62/245,900, filed on Oct. 23, 2015.

(51) Int. Cl.
| | |
|---|---|
| *H01L 25/065* | (2006.01) |
| *H01L 23/31* | (2006.01) |
| *H01L 23/48* | (2006.01) |
| *H01L 23/50* | (2006.01) |
| *H01L 23/528* | (2006.01) |
| *H01L 23/00* | (2006.01) |

(52) U.S. Cl.
CPC ...... *H01L 25/0652* (2013.01); *H01L 23/3107* (2013.01); *H01L 23/3135* (2013.01); *H01L 23/481* (2013.01); *H01L 23/50* (2013.01); *H01L 23/528* (2013.01); *H01L 24/09* (2013.01); *H01L 24/17* (2013.01); *H01L 2224/0905* (2013.01); *H01L 2224/13014* (2013.01); *H01L 2224/13016* (2013.01); *H01L 2224/16145* (2013.01); *H01L 2225/06513* (2013.01); *H01L 2225/06548* (2013.01); *H01L 2225/06589* (2013.01)

(58) Field of Classification Search
CPC ............. H01L 25/0652; H01L 23/3107
USPC ................................................. 257/738
See application file for complete search history.

(56) References Cited

U.S. PATENT DOCUMENTS

| | | | |
|---|---|---|---|
| 2010/0140779 A1* | 6/2010 | Lin | H01L 23/49816 257/690 |
| 2010/0246141 A1* | 9/2010 | Leung | H01L 24/82 361/735 |
| 2014/0103488 A1* | 4/2014 | Chen | H01L 24/83 257/532 |

(Continued)

*Primary Examiner* — Moazzam Hossain
(74) *Attorney, Agent, or Firm* — Sterne, Kessler, Goldstein & Fox P.L.L.C.

(57) ABSTRACT

A three-dimensional (3D) integrated circuit (IC) package is disclosed that contains a plurality of encapsulated layers stacked upon each other without the use of a substrate(s). Each of the encapsulated layers contains an encapsulating material, a die, an interconnecting interface, and vertical vias. The encapsulating material forms the surfaces of an encapsulated layer and encapsulates the die. The interconnecting interface provides an interface at a surface of the encapsulated layer for the die to electrically connect to other dies or external components. The vertical vias provide a conduction path between interconnecting interfaces of different encapsulated layers.

12 Claims, 21 Drawing Sheets

(56) References Cited

U.S. PATENT DOCUMENTS

2015/0303174 A1* 10/2015 Yu ................. H01L 25/0657
                                                257/712

* cited by examiner

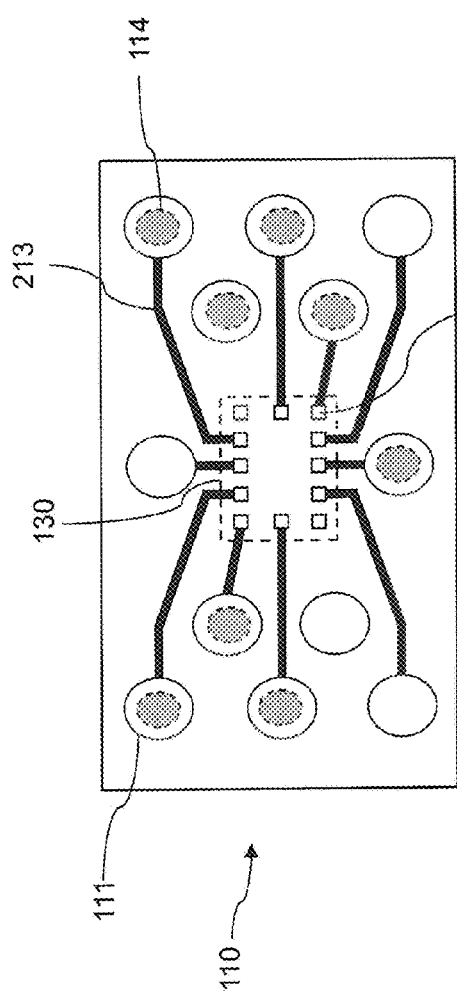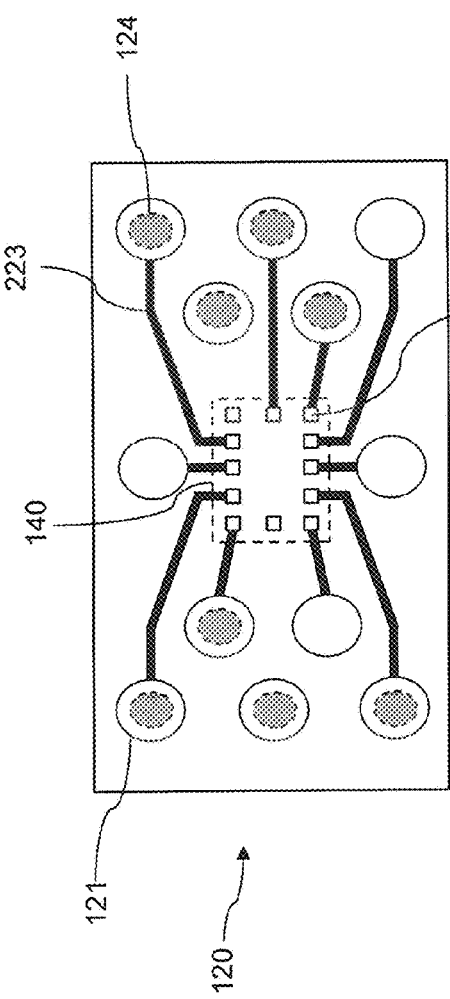

FAN-OUT 3D IC INTEGRATION STRUCTURE WITHOUT SUBSTRATE AND METHOD OF MAKING THE SAME

CROSS REFERENCE TO RELATED APPLICATIONS

The present application claims the benefit of U.S. Provisional Patent Application No. 62/245,900, filed on Oct. 23, 2015, which is hereby incorporated by reference in its entirety.

BACKGROUND

Field

Embodiments described herein generally related to integrated circuit (IC) device packaging technology.

Background

Moore's law is a prediction that the number of transistors in an IC would double each year. Over the years, this prediction has become the golden rule for IC devices. However, as current technologies have reduced in size, the application of Moore's law has become more difficult to implement. Accordingly, other technologies such as three dimensional (3D) chip packaging or chip stacking are used in the manufacturing process to minimize the size of an overall IC device, and the distance between multiple chips in the IC device.

BRIEF DESCRIPTION OF THE DRAWINGS/FIGURES

The accompanying drawings, which are incorporated herein and form a part of the specification, illustrate embodiments of the present disclosure and, together with the description, further serve to explain the principles of the disclosure and to enable a person skilled in the pertinent art to make and use the embodiments.

FIGS. 2A-2B illustrate bottom-up views of different layers of the 3D IC chip package of FIG. 1 according to embodiments of the disclosure.

FIG, 4 illustrates a cross-sectional view of a 3D IC chip package according to embodiments of the disclosure.

Figure 5:
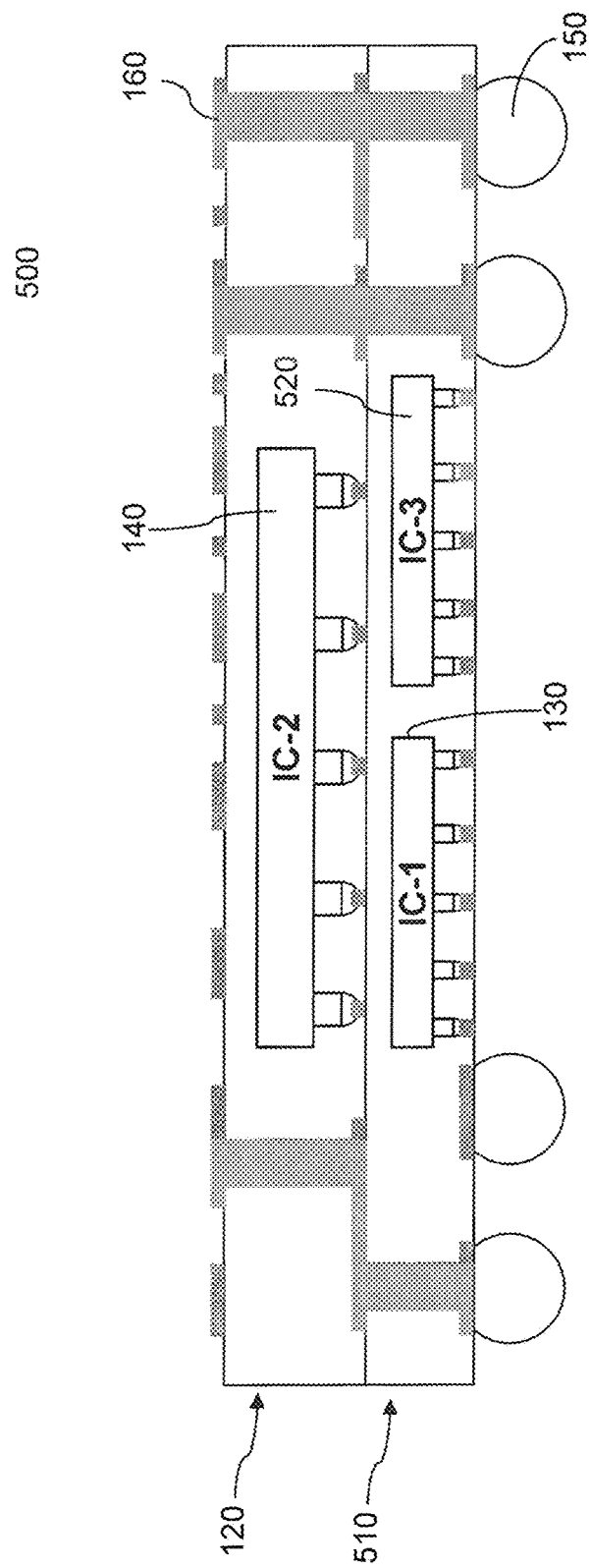

FIG. 5 illustrates a 3D IC package wherein at least one of the layers may include multiple dies according to embodiments of the disclosure.

Figure 6:
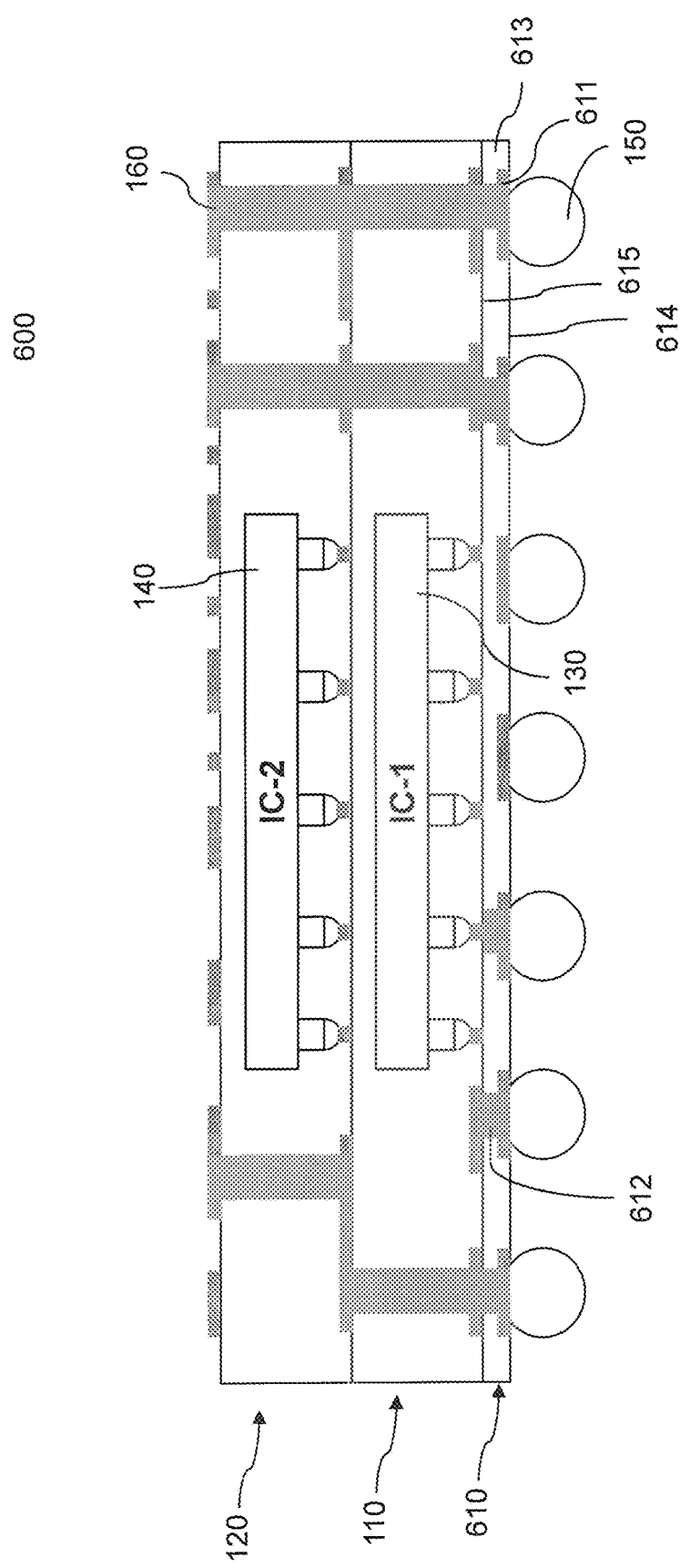

FIG. 6 illustrates a cross-sectional view of a 3D IC chip package according to embodiments of the disclosure.

Figure 7:
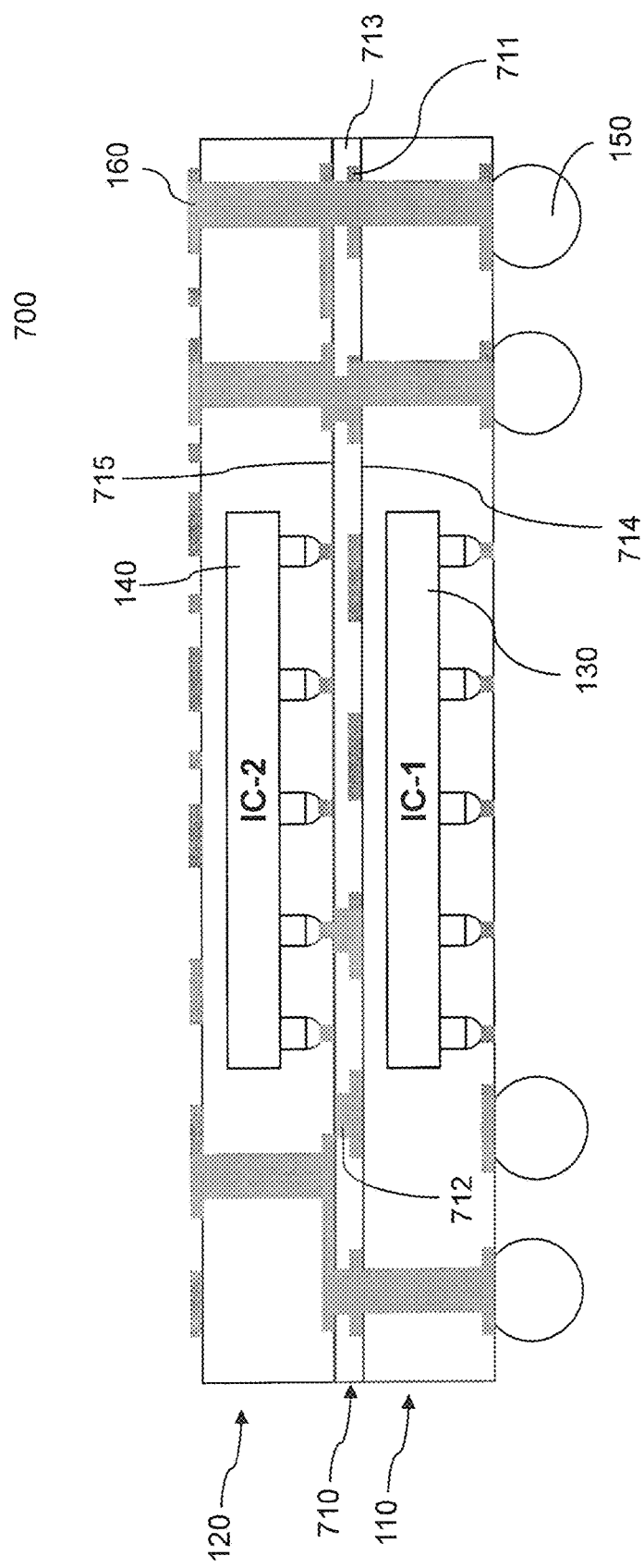

FIG. 7 illustrates a cross-sectional view of a 3D IC chip package according to embodiments of the disclosure.

Figure 8:
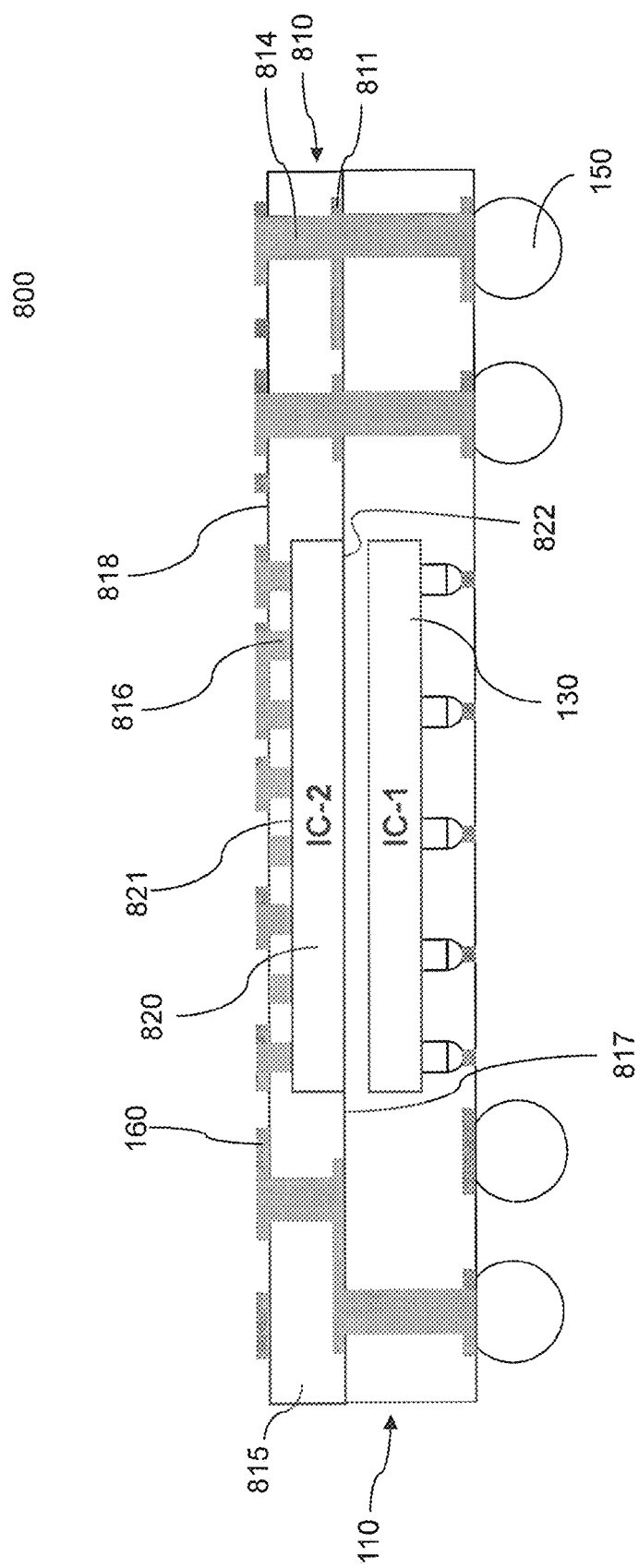

FIG. 8 illustrates a cross-sectional view of a 3D IC chip package according to embodiments of the disclosure.

Figure 9:
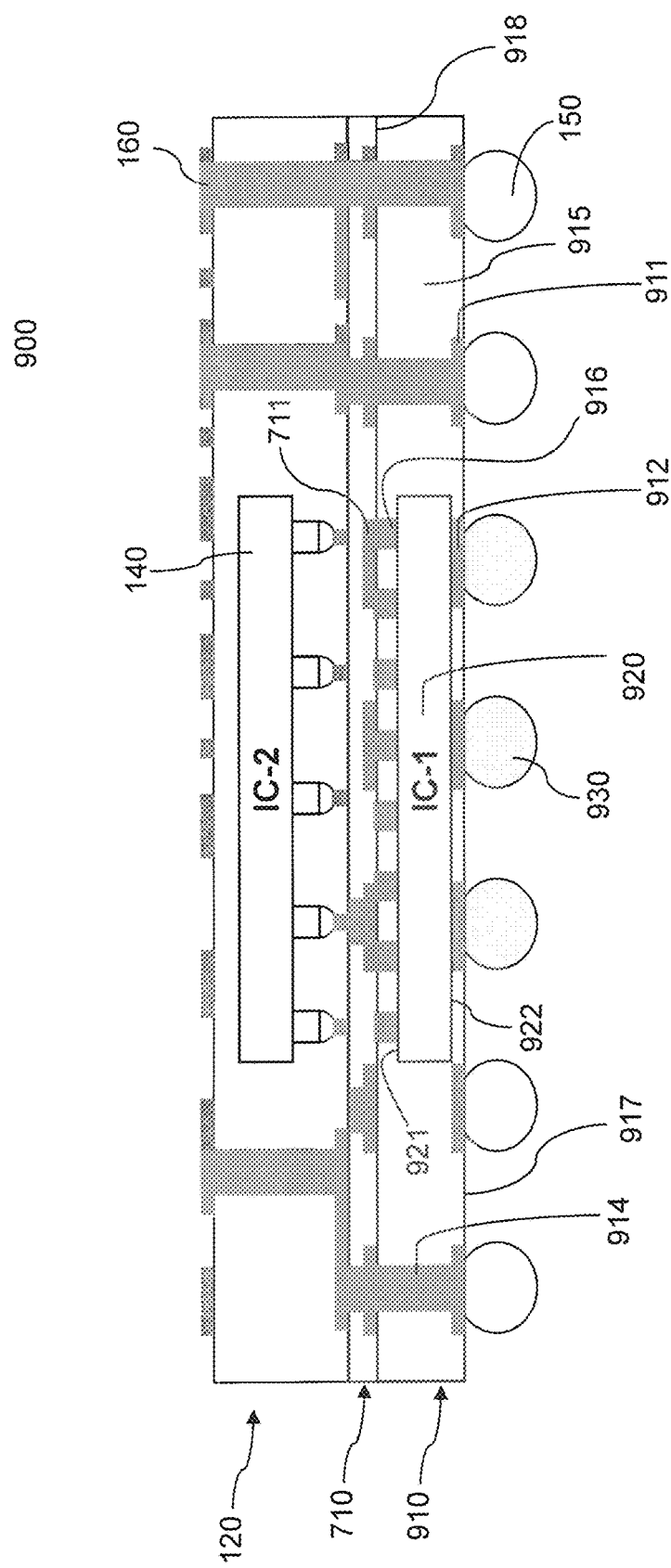

FIG. 9 illustrates a cross-sectional view of a 3D IC chip package according to embodiments of the disclosure.

Figure 10:
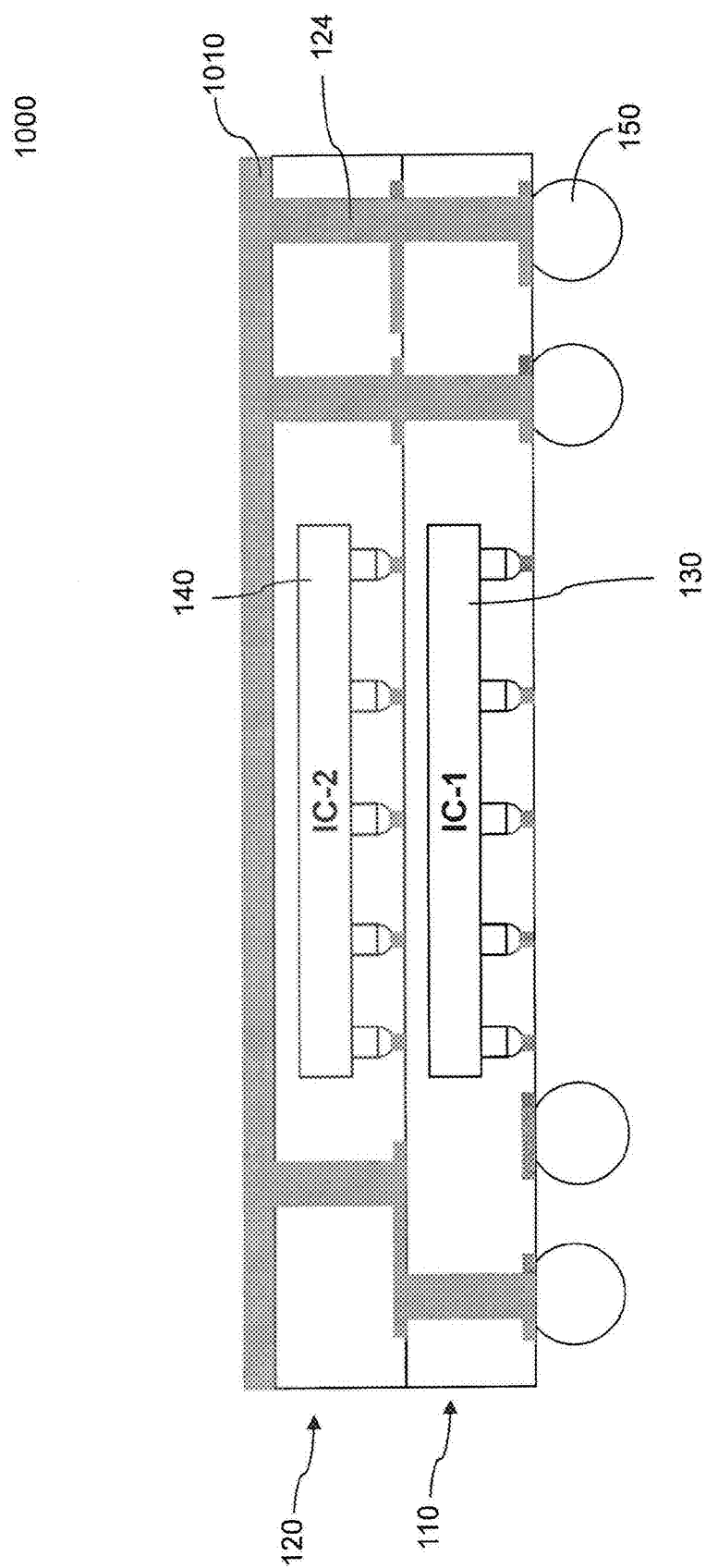

FIG. 10 illustrates a cross-sectional view of a 3D IC chip package according to embodiments of the disclosure.

Figure 11A:
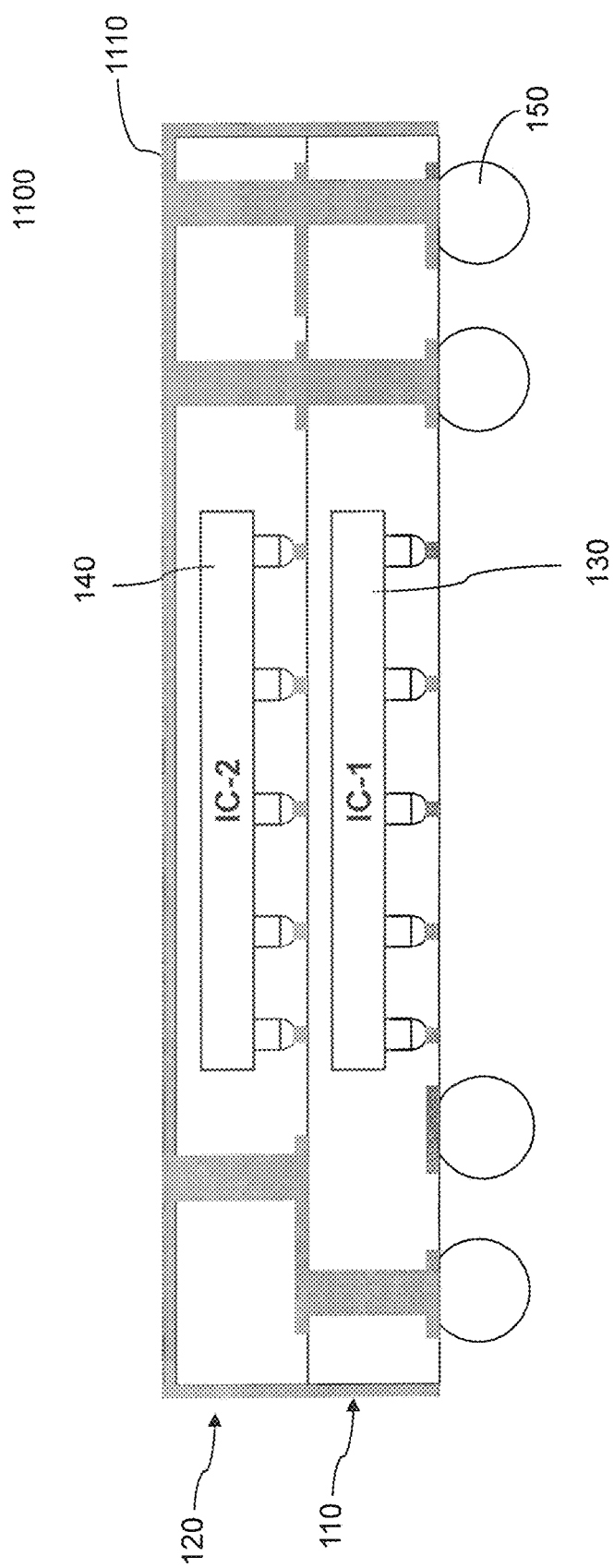
Figure 11B:
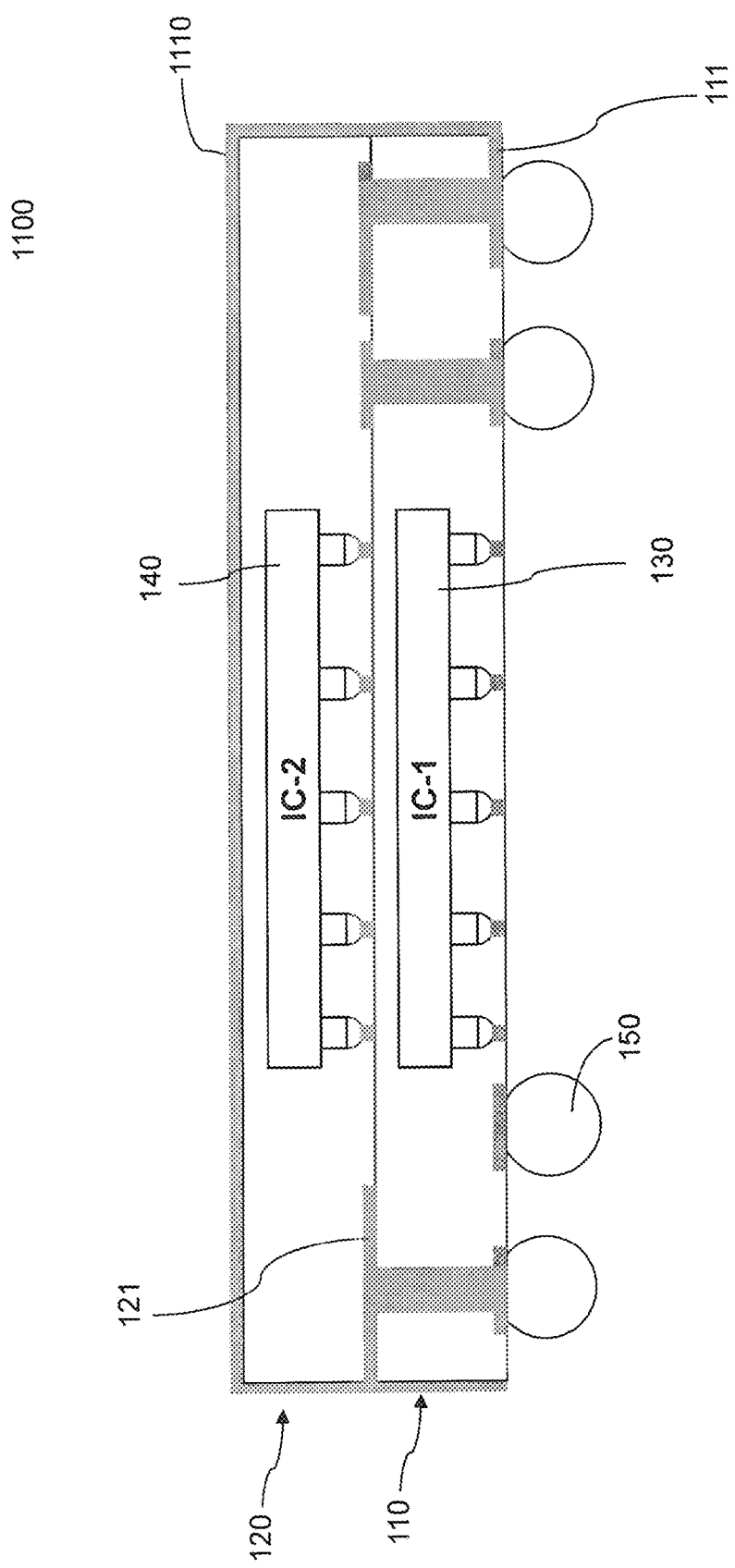

FIG. 11A-11B illustrate cross-sectional views of a 3D IC chip package according to embodiments of the disclosure.

Figure 12:
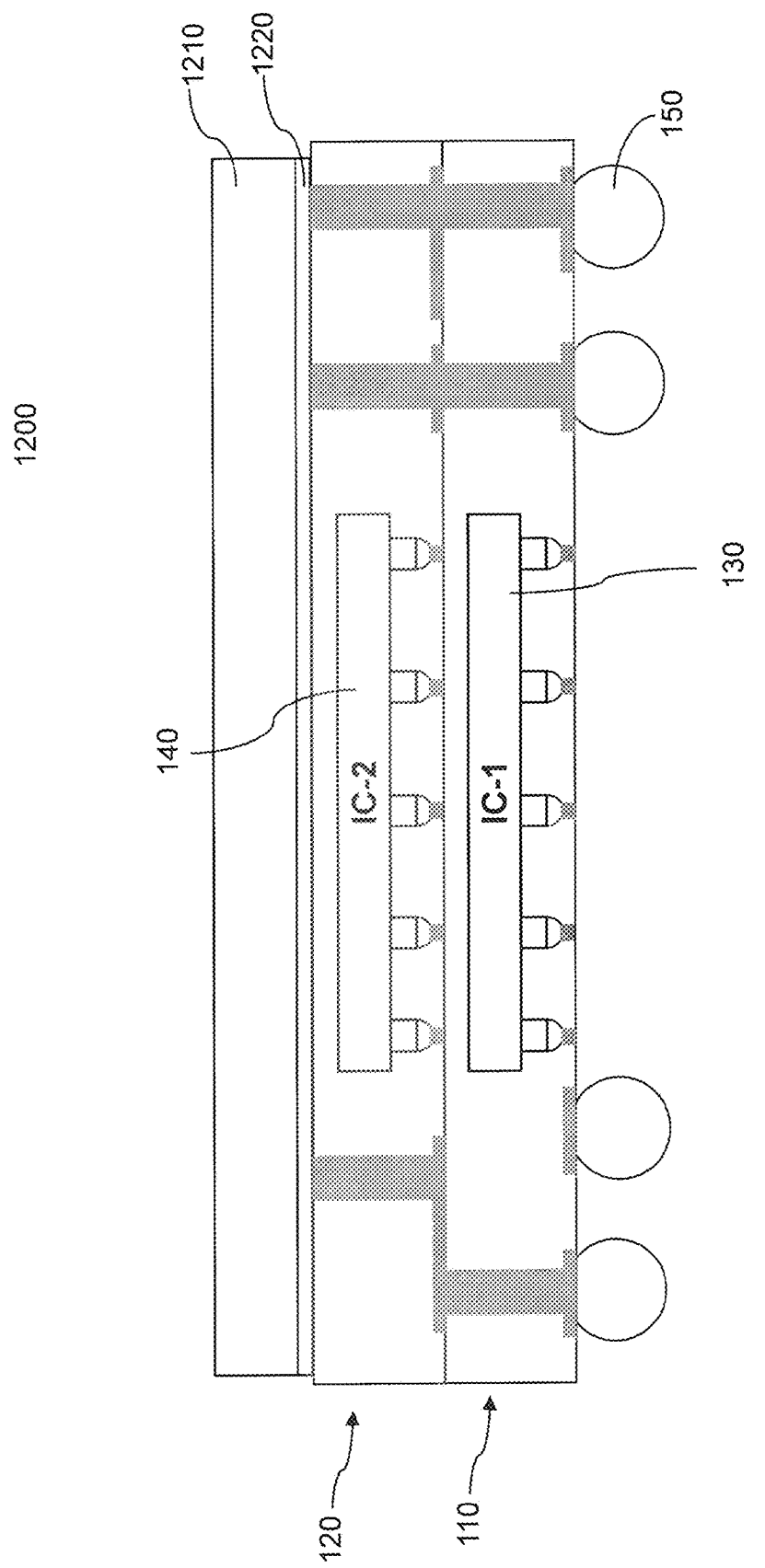

FIG. 12 illustrates a cross-sectional view of a 3D IC chip package according to embodiments of the disclosure.

The present disclosure will be described with reference to the accompanying drawings. The drawing in which an element first appears is typically indicated by the leftmost digit(s) in the corresponding reference number.

DETAILED DESCRIPTION

Methods, systems, and apparatuses for integrated circuit (IC) device packaging technology are described herein. In particular, methods, systems, and apparatuses for interconnecting multiple devices in and to an IC package to form an improved IC package are described.

References in the disclosure to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above", "below", "left," "right," "up", "down", "top", "bottom", etc.) used herein are for purposes of illustration only, and that practical implementations of the structures described herein can be spatially arranged in any orientation or manner, Overview A three-dimensional (3D) integrated circuit (IC) package is disclosed that contains a plurality of encapsulated layers stacked upon each other without the use of a substrate(s). Each of the encapsulated layers contains an encapsulating material, a die, an interconnecting interface, and vertical vias. The encapsulating material forms the surfaces of an encapsulated layer and encapsulates the die. The interconnecting interface provides an interface at a surface of the encapsulated layer for the die to electrically connect to other dies or external components. The vertical vias provide a conduction path between interconnecting interfaces of different encapsulated layers.

Exemplary IC Package without a Substrate(s)

Figure 1:
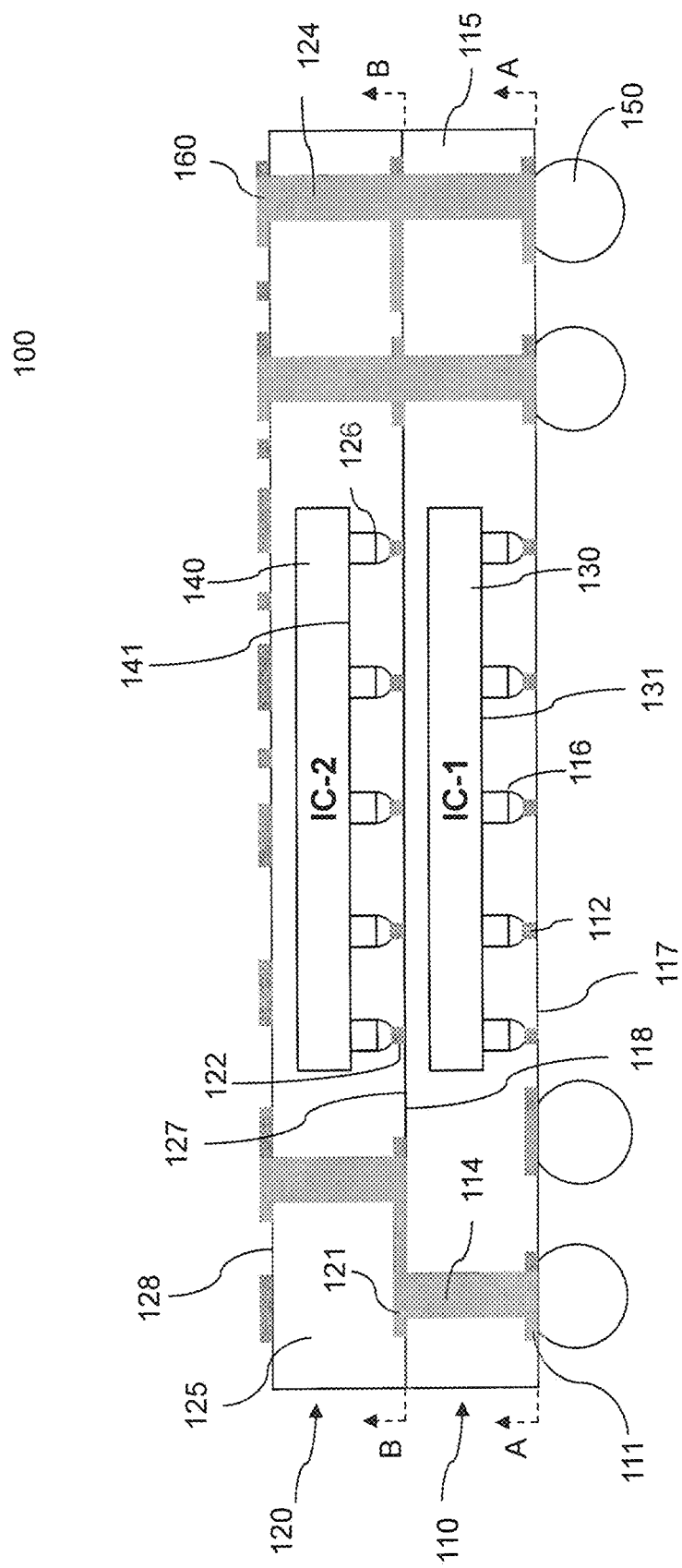
FIG. 1 illustrates a cross-sectional view of a 3D IC chip package according to embodiments of the disclosure.

FIG. 1 illustrates a cross-sectional view of a 3D IC chip package according to embodiments of the disclosure. FIGS. 2A-2B illustrate bottom-up views of different layers of the 3D IC chip package of FIG. 1, according to embodiments of the disclosure.

As shown by FIG. 1, IC package 100 includes multiple encapsulated layers. In particular, IC package 100 includes a first encapsulated layer 110 and a second encapsulated layer 120. The first encapsulated layer 110 includes I/O pads 111, contact pads 112, vertical vias 114, a First die 130, an encapsulating material 115, and die connectors 116.

Figure 3A:
FIGS. 3A-3J illustrate cross-sectional views of the manufacturing process of the 3D IC chip package of FIG. 1 according to embodiments of the disclosure.
Figure 3B:
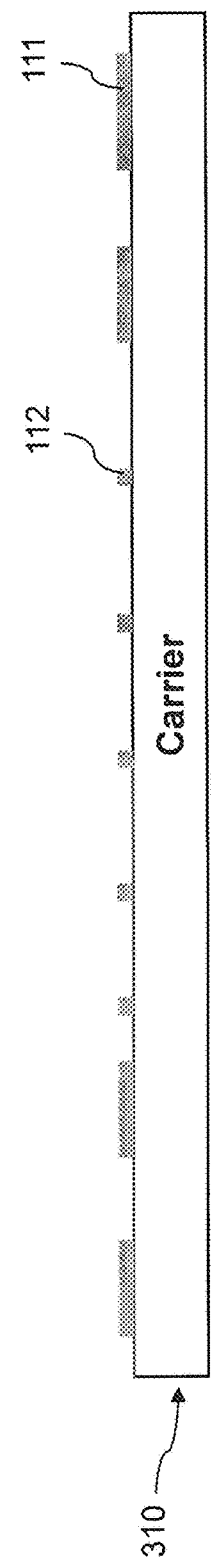
Figure 3C:
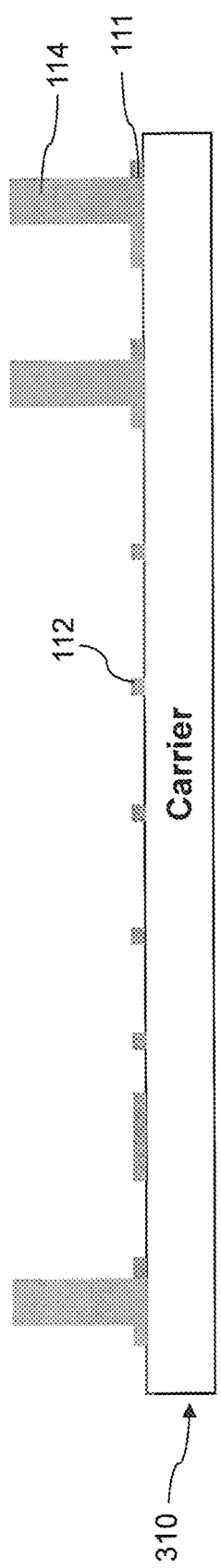
Figure 3D:
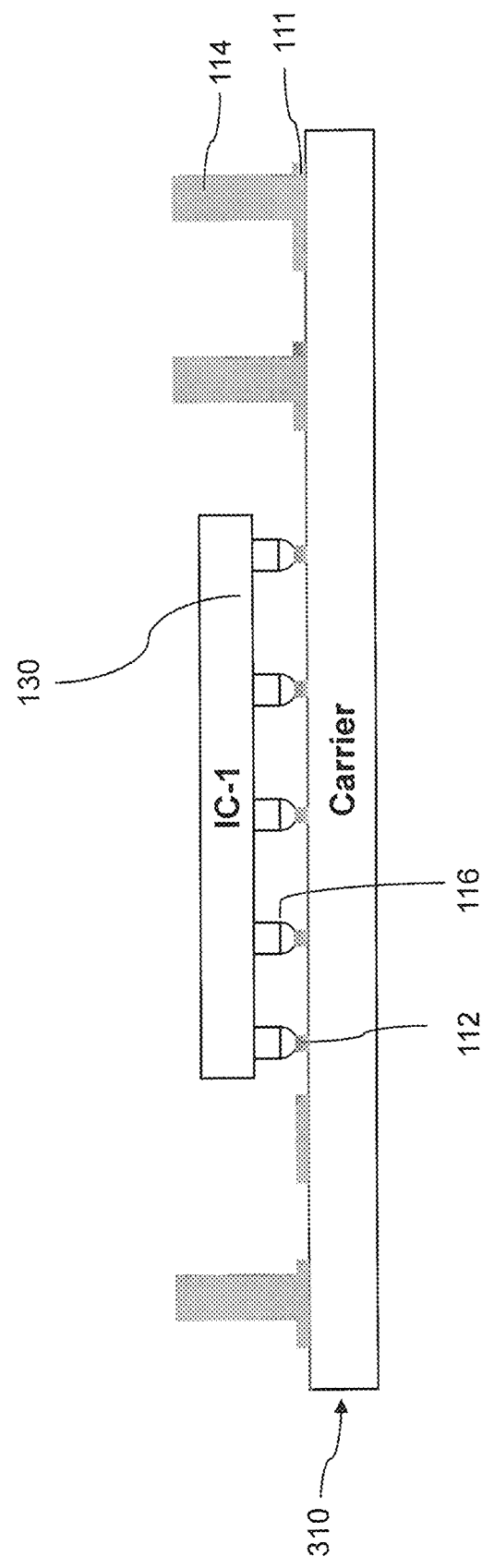
Figure 3E:
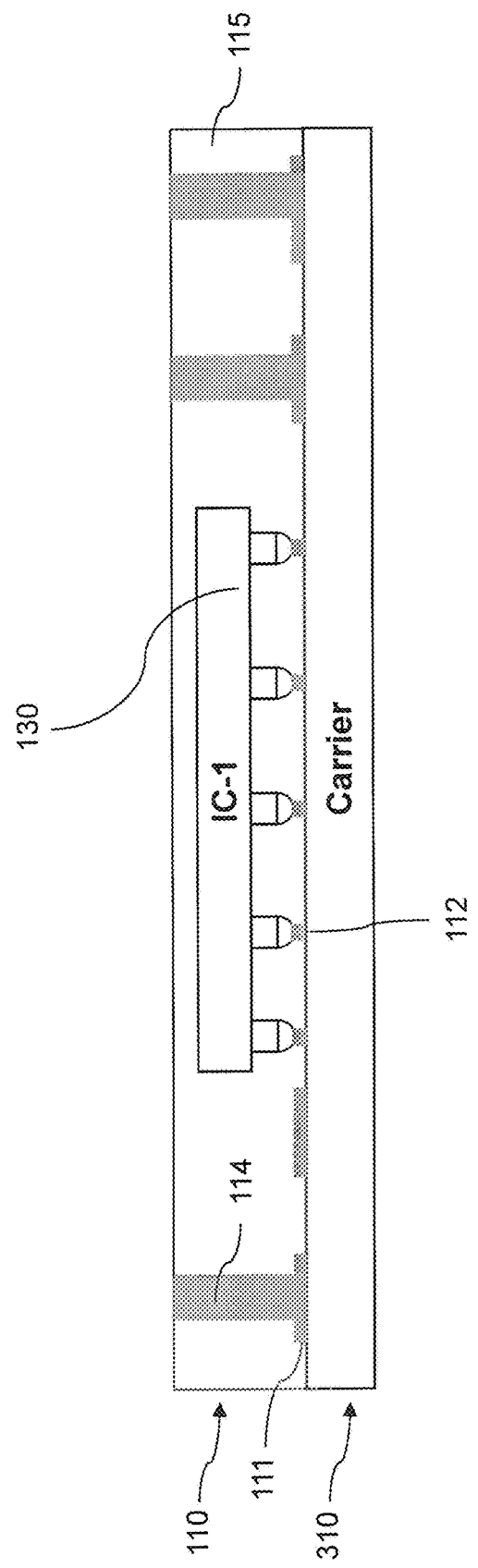
Figure 3F:
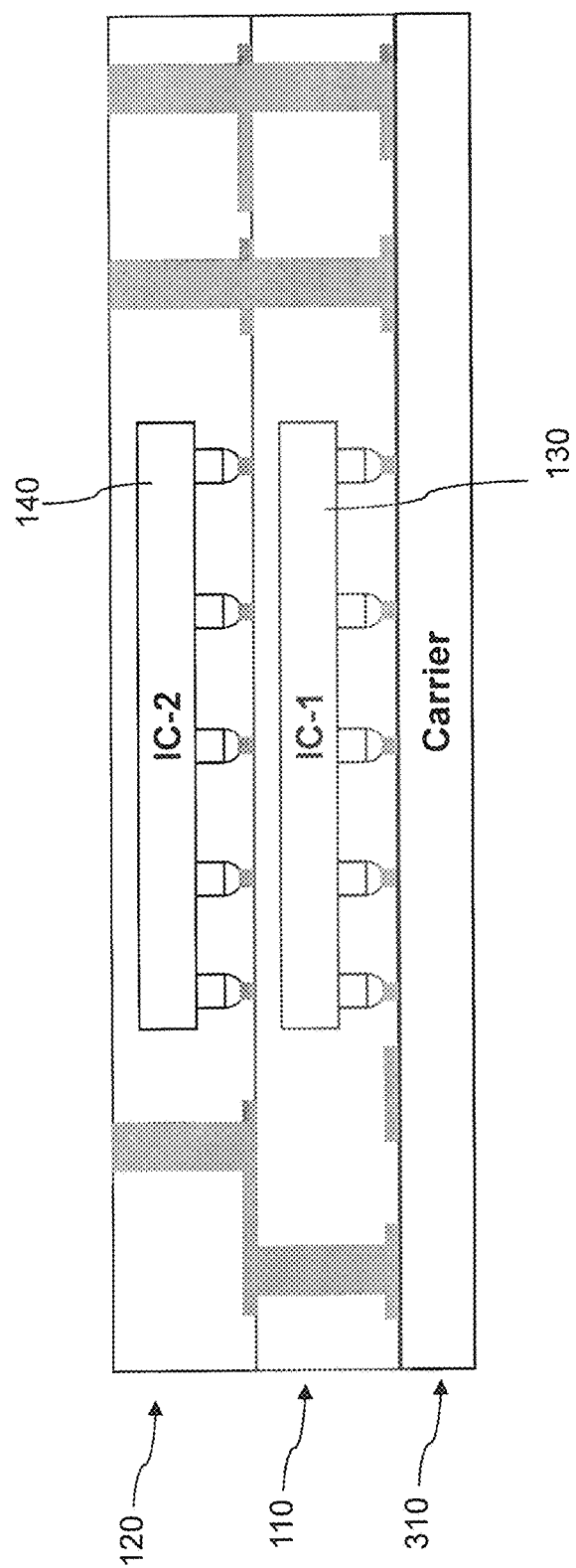
Figure 3G:
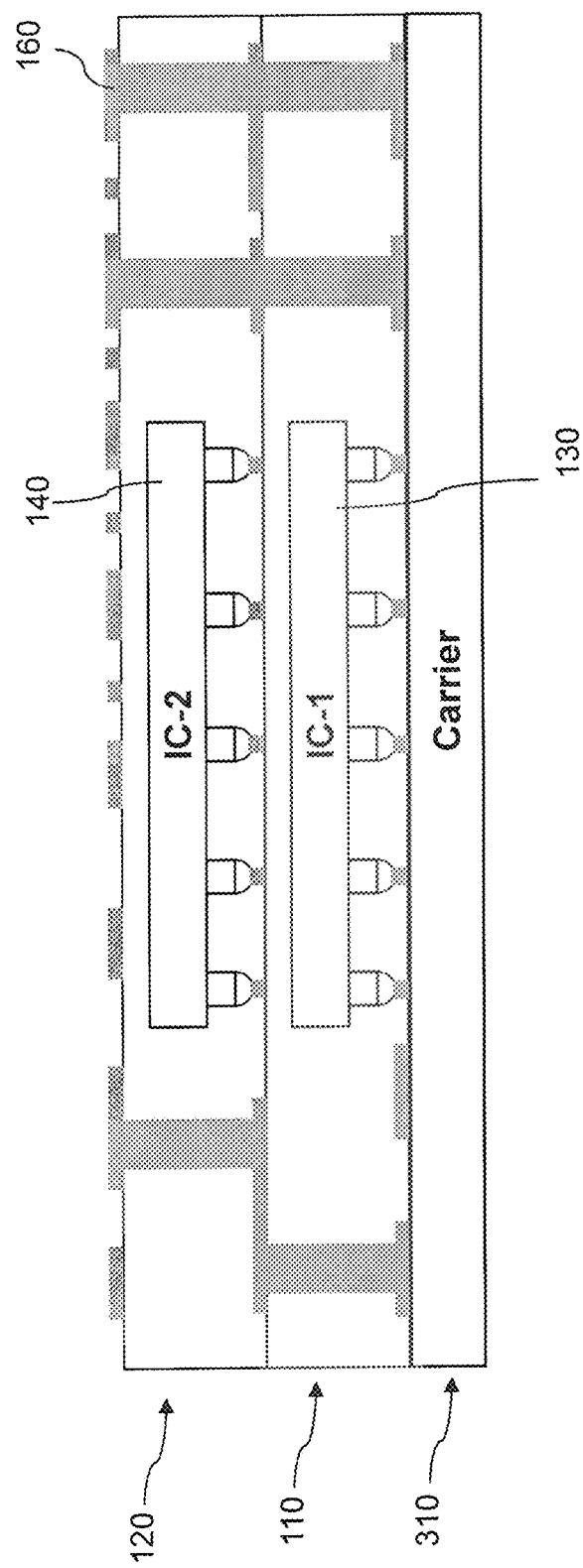
Figure 3H:
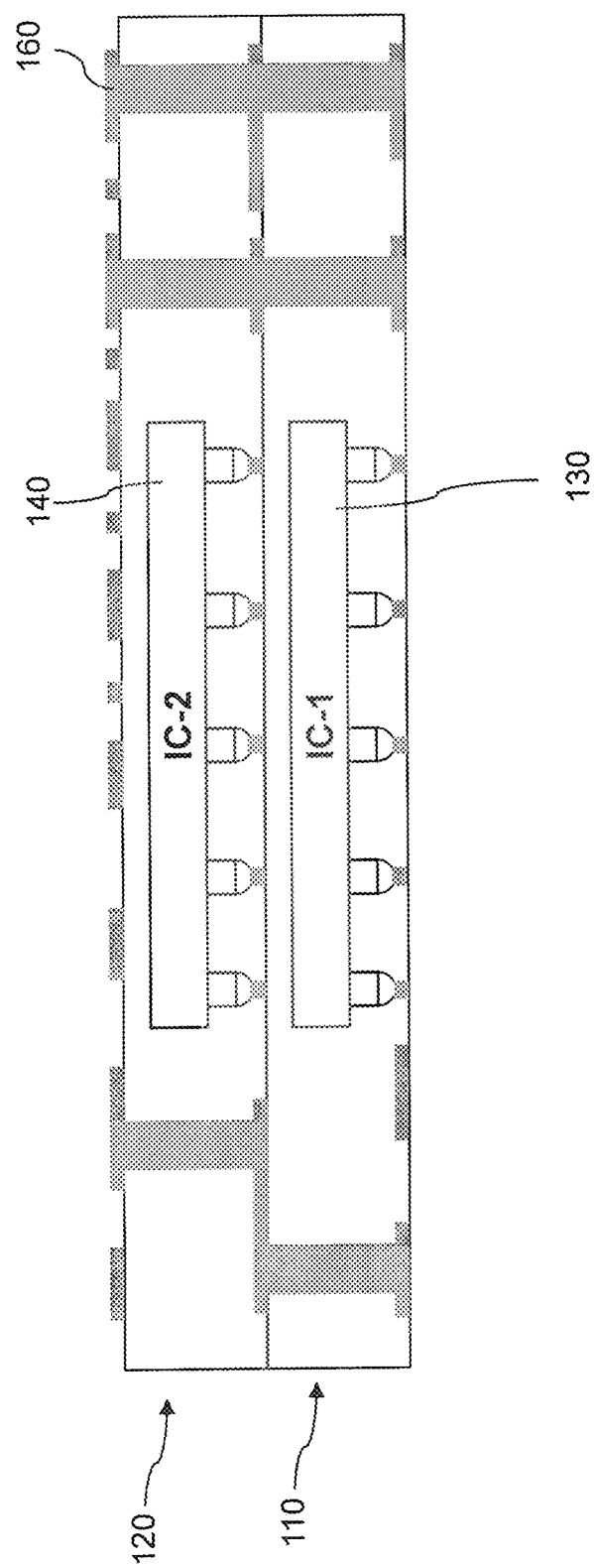
Figure 3I:
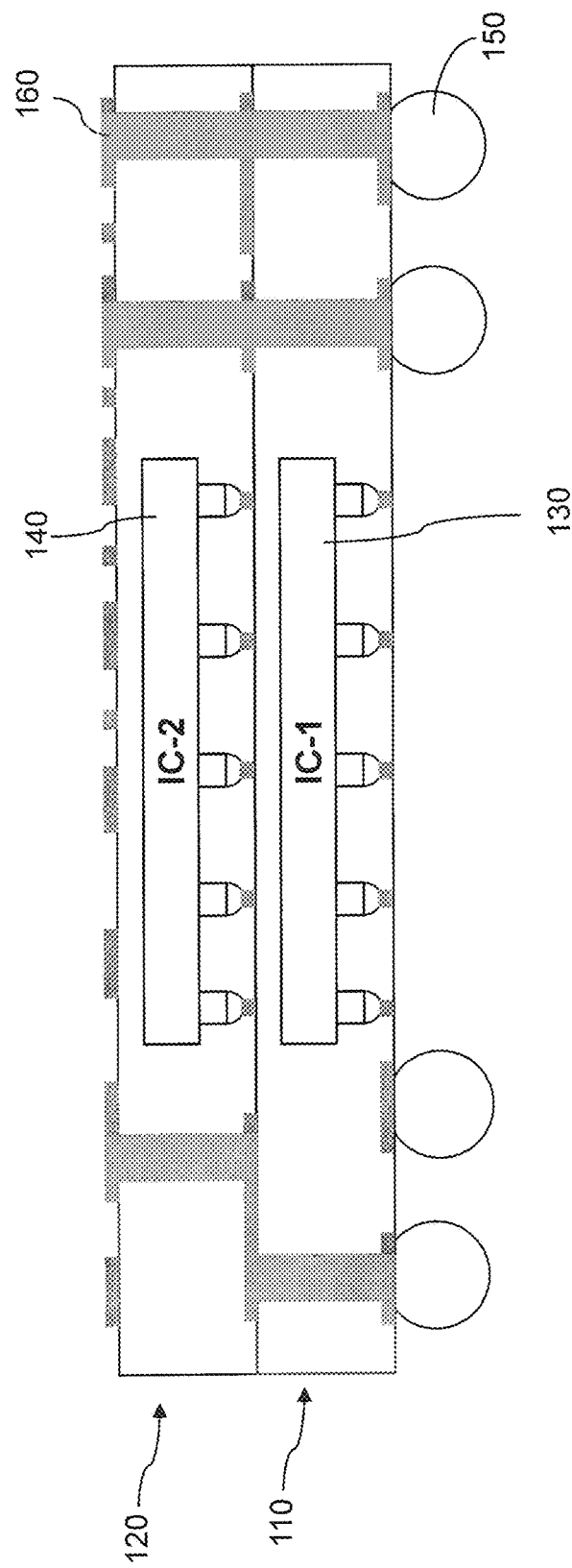
Figure 3J:
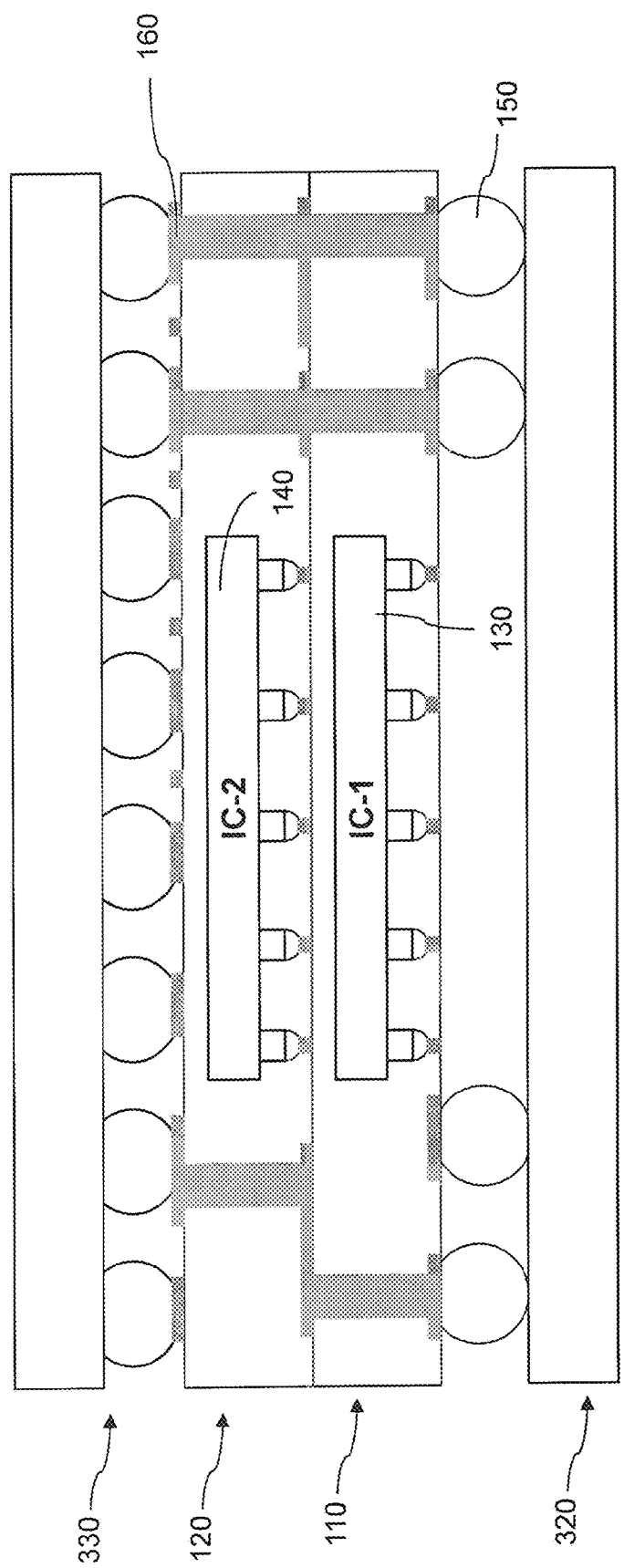

The I/O pads 111 provide a conductive interface for the IC package 100 to attach to other components such as a printed circuit board (PCB) (see e.g., PCB 320 on FIG. 3J). For example, solder balls 150 can be bonded to the I/O pads 111 to electrically connect the IC package 100 to the PCB. The I/O pads 111 are configured to interface a die(s) in the first encapsulated layer 110 and/or a PCB. Also, as will be shown, the I/O pads 111 are configured to interface a die(s) in the first encapsulated layer 110 with other dies within the IC package 100, and/or an external component (see e.g., external component 330 on FIG. 3J) by way of the external interface layer 160.

The contact pads 112 provide interface connections to connect an active surface 131 of the first die 130 to other portions of the IC package 100. As illustrated by FIG. 1, the contact pads 112 connect to the active surface 131 of the first die 130 by way of die connectors 116. Die connectors 116 can include, for example, conductive pillars with solder caps or solder bumps, however, other means of electrically connecting the contact pads 112 to the first die 130 may be used.

FIG. 2A illustrates a bottom-up view of the IC package 100 taken at cross-section A-A that is shown in FIG. 1. The contact pads 112 are electrically connected to the I/O pads 111 by way of leads or metal traces 213 ("traces"). Further, FIG. 2A illustrates an exemplary interconnect layout for the first encapsulated layer 110. As shown, traces 213 electrically connect the contact pads 112 and the I/O pads 111. The traces 213 are arranged and designed considering the needs and functions of the first die 130. In this example embodiment, the I/O pads 111, the contact pads 112, and the traces 213 may collectively be referred to as the first interconnect layer. The first interconnect layer can be made of a conductive material(s) such silver, copper, gold, or aluminum.

The vertical vias 114 provide an electrical connection path from the I/O pads 111 to other layers of the IC package 100, and/or components external to the IC package 100 (see e.g., FIG. 3J). As shown by FIGS. 1 and 2A, the vertical vias 114 provide an electrical path between at least one of the first die 130 and the solder balls 150 to at least one of the second die 140 and the external interface layer 160, as examples. The vertical vias 114 are formed on the I/O pads 111 in consideration of the connection needs and functions of the IC package 100. For example, as shown by FIG. 2A, the vertical vias 114 can be formed on some of the I/O pads 111 to electrically connect the first die 130 to the second die 140, and/or the external interface layer 160. The vertical vias 114 are made of a conductive material such as silver, copper, gold, or aluminum.

The encapsulating material 115 encapsulates the first die 130 to provide protection from the environment and covers at least a portion of the I/O pads 111, the contact pads 112, the traces 113, and the vertical vias 114. In other embodiments, as will be discussed later, portions of the first die 130 may be exposed at one of the surfaces of the first encapsulated layer 110. The encapsulating material 115 can be made of a mold compound (e.g. molding compound) or an epoxy material.

The encapsulating material 115 forms the surfaces of the first encapsulated layer 110. Accordingly, the encapsulating material 115 forms the bottom or first surface 117 and the top or second surface 118 of the first encapsulated layer 110. During manufacturing, the encapsulating material 115 is configured to leave the I/O pads 111 exposed at the first surface 117 of the first encapsulated layer 110 to facilitate connection to an external component such as the PCB by way of the solder balls 150. As shown by FIG. 1, the first interconnect layer is exposed to the environment considering the connection needs and functions of the IC package 100. Accordingly, the solder balls 150 are omitted from an area below the active surface 131 of the die 130 to avoid shorting multiple contact pads 112 or traces 113 together. In another embodiment, the solder balls 150 may be attached to the area below the active surface 131 of the die 130, considering the connection needs and functions of the IC package 100. For example, solder balls 150 may be arranged below the active surface 131 of the die 130 when the connection needs and functions of the IC package 100 require multiple contact pads 112 to be shorted together.

The second encapsulated layer 120 includes via pads 121, contact pads 122, vertical vias 124, a second die 140, an encapsulating material 125, and die connectors 126. The via pads 121 are configured to provide a conductive interface between lower layer components and upper layer components. FIG. 2B illustrates a bottom-up view of the IC package 100 taken at cross-section B-B that is shown in FIG. 1. The via pads 121 are configured to connect to the contacts pads 122 by way of leads or traces 223 as shown by FIG. 2B, and/or can be connected to the exposed surface by way of the vertical vias 114, as shown by FIG. 1.

The contact pads 122 provide an interface to electrically connect an active surface 141 of the second die 140 to remaining portions of the IC package 100. The contact pads 122 electrically connect to respective bond pads of the second die 140 by way of die connectors 126. As shown by FIG. 1, the die connectors 126 can include conductive pillars with solder caps and/or solder bumps. However, those of ordinary skill in the art will recognize that other means of connection can be used. In this embodiment, the via pads 121, the contact pads 122, and the traces 223 may collectively be referred to as the second interconnect layer.

The vertical vias 124 provide an electrical connection path between the via pads 121 and upper layers of the IC package 100 (e.g., the external interface layer 160). As shown by FIG. 2B, the vertical vias 124 provide an electrical path between at least one of the first die 130, the second die 140, and the solder balls 150 to the external interface layer 160. For example, the vertical vias 124 may be configured to electrically connect the second die 140 to the external interface layer 160 and/or electrically connect the first die 120 to the external interface layer 160. The vertical vias 124 are bonded to the via pads 121 and are made of a conductive material such as copper, gold, or aluminum.

The encapsulating material 125 encapsulates the second die 140 to provide protection from the environment and covers at least a portion of the via pads 121, the contact pads 122, the traces 223, and the vertical vias 124. In other embodiments, as will be discussed later, portions of the second die 140 may be exposed at one of the surfaces of the second encapsulated layer 120. The encapsulating material 125 can be made of a mold compound or an epoxy material. The encapsulating material 125 can be the same as the encapsulating material 115. The encapsulating material 125 can also be substantially different in type, filler particle material, and properties from encapsulating material 115 to achieve desired package electrical, thermal, and mechanical properties that improve IC die and package performance, reliability, and manufacturability.

The encapsulating material 125 forms the surfaces of the second encapsulated layer 120. Accordingly, the encapsulating material 125 forms the bottom or first surface 127 and the top or second surface 128 of the second encapsulated layer 120.

The solder balls 150 are configured to facilitate connection between the IC package 100 to an external device or the PCB. The solder balls 150 are made of conductive material such as tin or lead. In other embodiments, the IC package 100 may not include the solder balls 150 during manufacturing, thereby leaving the I/O pads 111 exposed to the environment at the first surface 117 of the first encapsulated layer 110.

The external interface layer 160 is configured to bond to the second surface 128 of the second encapsulated layer 120. The external interface layer 160 provides conductive interface connections between the IC package 100 and an external component such as a memory device, wireless device, or another IC package (see e.g., FIG. 3J). In particular, the external interface layer 160 includes pads and traces for routing a signal and/or communication between the IC package 100 and the external component. In other embodiments, the external interface layer 160 may be omitted from the IC package 100 during manufacturing thereby leaving the vertical vias 124 exposed at the second surface 128 of the second encapsulated layer 120.

Accordingly, embodiments of the present disclosure provide a 3D IC package having IC dies that are stacked without the use of a silicone interposer or substrate. By omitting substrate layers from the 3D IC package, the overall size and manufacturing of the 3D IC package may be reduced because less material is used.

Exemplary Process of Manufacturing a 3D IC Package without a Substrate(s)

In a typical 3D DD package having a substrate(s), IC devices with substrates are manufactured independently and individual packages are then stacked by way of solder balls as exemplified by package-on-package (PoP) technologies. However, a 3D IC package in accordance with embodiments of the present disclosure allows an entire stacking process to be performed using a wafer format or a panel format. Thus, an overall size of the 3D IC package is reduced because individual substrates are omitted along with solder balls between layers during the manufacturing process.

FIGS. 3A-3J illustrate cross-sectional views of the manufacturing process of the 3D IC chip package of FIG. 1, according to embodiments of the disclosure. In step 1, as shown by FIG. 3A, a carrier 310 is provided as a base on which an IC package 100 can be formed. The carrier 310 can be a typical metal carrier used during wafer processing. The carrier 310 surface may or may not include a release thin film layer (not shown) for carrier support structure release. Next, as shown by FIG. 3B, the first interconnect layer including the I/O pads 111, the metal contact pads 112, and the traces 113 are formed on the surface of the carrier 310 in step 2. The first interconnect layer may be formed by a plating method. A layout of the first interconnect layer is patterned considering, the connection needs and functions of the IC package 100. In step 3, the vertical vias 114 are formed on surfaces of the I/O pads 111, as shown by FIG. 3C. The vertical vias 114 can be formed by a plating process, a bonding process, or a metal layering process.

Next, the attachment of the first die 130 is performed in step 4. The active surface 131 of the die 130 is attached to the contact pads 112 in step 4, as shown by FIG. 3D, by way of the die connectors 116. The die connectors 116 can be bonded to corresponding bond pads on the active surface 131 of the die 130 by way of an oven reflow process or thermal compression bonding process. The encapsulating material 115 is then formed, during step 5, to encapsulate at least the IC die 130, as shown by FIG. 3E, to form the first encapsulation layer 110 and provide a base on which the second encapsulated layer 120 can be formed. A removal process, such as grinding, etching, or chemical removal, may be performed on the encapsulating material 115 to expose the vertical vias 114 and the second surface 118 of the first encapsulating layer 110 may be planarized.

As illustrated by FIG. 3F, and discussed above in regards to FIG. 1, the second encapsulated layer 120 is formed on the second surface 118 of the first encapsulated layer 110. During the formation of the second encapsulated layer 120, the second interconnect layer is patterned considering the connection needs and functions of the IC package 100, which may or may not be the same pattern as the first interconnect layer (see e.g., FIG. 2B). The remaining processes of forming the second encapsulated layer 120 are similar to that of forming the first encapsulated layer 110, as described by steps 2-5. Thus, steps 2-5 can be repeated to manufacture the second encapsulated layer 120. Further, a removal process, such as grinding, etching, or chemical removal, may be performed on the second surface 128 of the second encapsulated layer 120 to expose the vertical vias 124 and the second surface 128 of the second encapsulated layer 120 may be planarized.

In step 6, the external interface layer 160 can be formed on the second surface 128 of the second encapsulated layer 120, as shown by FIG. 3G, and as discussed above in regards to FIG. 1. During step 6, the external interface layer 160 is patterned considering the connection needs and functions of the IC package 100 and connections of a predetermined external component. Further, in other embodiments, step 6 is not performed because the external interface layer 160 can be omitted during the manufacturing of the IC package 100.

In step 7, the carrier 310 is removed, leaving the basic IC package 100, as illustrated by FIG. 3H. It will be apparent to those skilled in the relevant art that any removal process such as thermal release, grinding, or chemical removal may be used to separate or remove the carrier 310. Next, in step 8, solder balls 150 can be attached to the I/O pads 111 of first interconnect layer, as shown by FIG. 3I, by a reflow process. In step 9, the IC package 100 is attached to a PCB 320 and/or an external component 330. In this step, the solder balls 150 bond to corresponding connections on the PCB 320 and bond by way of a reflow process. Similarly, the external component 330 can be attached to the external interface layer 160, as shown by FIG. 3J, by a reflow process. However, in another embodiment, steps 8 and 9 may be omitted during the manufacturing of the IC package 100.

It will be apparent to those skilled in the relevant art that in other embodiments of the present disclosure one or more of the steps may be performed in different orders (e.g., step 4 may be performed prior to step 3), may be omitted (e.g., steps 6-8 may be omitted), may be repeated as needed to form additional encapsulated layers (see e.g., additional encapsulated layer 410 of FIG. 4) or to include additional dies (see e.g., additional die 510 of FIG. 5), and/or additional steps may be added (as discussed in regards to other embodiments below) according to the connection needs and functions of the IC package 100 and the manufacturing process of an IC package manufacturer.

Exemplary IC Package with Additional encapsulated Layers

Figure 4:
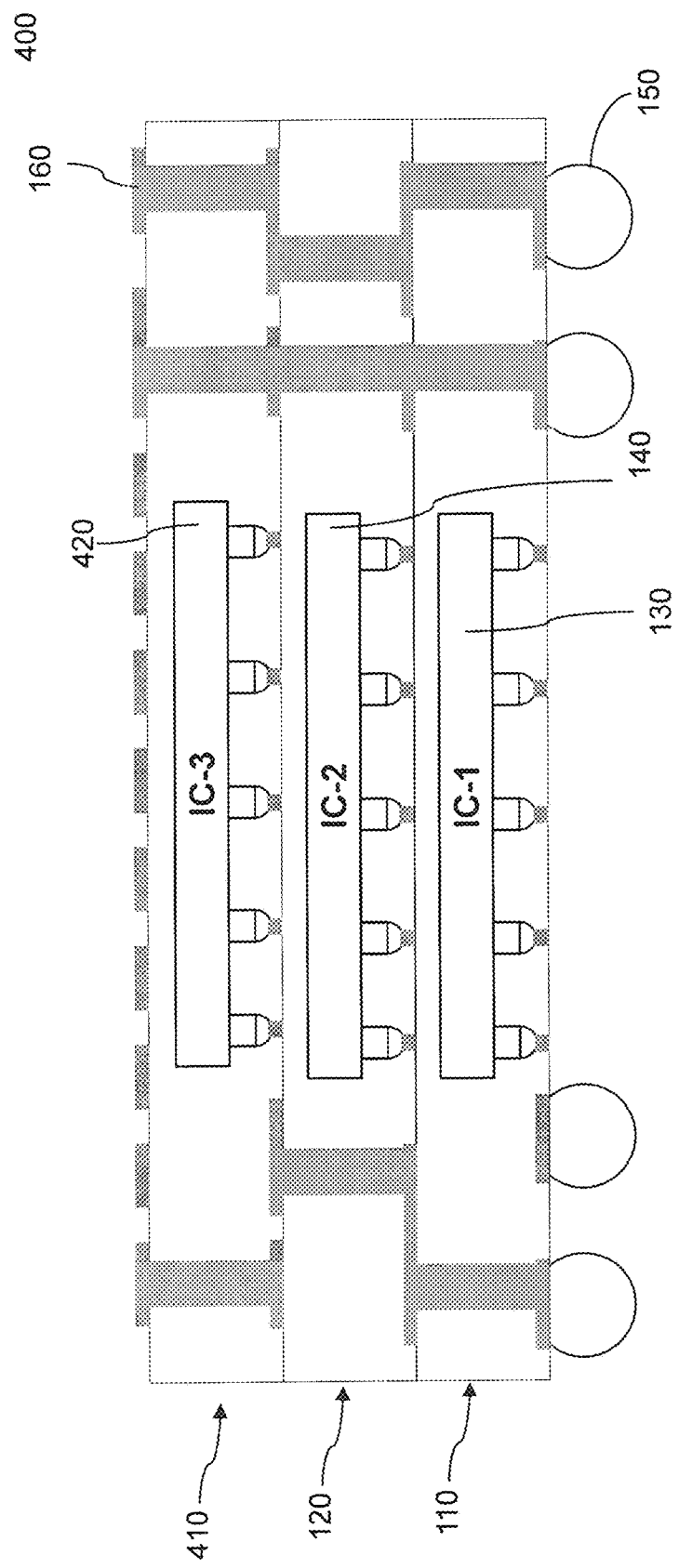

FIG. 4 illustrates another embodiment of a 3D IC package according to embodiments of the disclosure. In particular, FIG. 4 illustrates an IC package 400 having a third encapsulated layer 410. The third encapsulated layer 410 is manufactured on the second surface 128 of the second encapsulated layer 120 and includes a third die 420. The third encapsulated layer 410 further includes via pads, contact pads, traces (not shown), vertical vias, encapsulating material, and die connectors similar to those of the second encapsulated layer 120. For brevity, further detail on these features is omitted since it was described above.

During manufacturing of the IC package 400, after the carrier 310 is provided in step 1, the steps 2-5 would be repeated three times, one for each of the encapsulated layers 110, 120, 410. It will be apparent to those skilled in the relevant art that in other embodiments of the present disclosure, the IC packages 100 and 400 may include any number of encapsulated layers depending on the needs and functions of each of the IC packages 100 and 400.

Exemplary IC Package with Additional Dies

FIG. 5 illustrates another embodiment of a 3D IC package according to embodiments of the disclosure. In an embodiment, at least one of the layers may include multiple dies.

For example, as shown be FIG. 5, the IC package 500 includes an encapsulated layer 510 and the second encapsulated layer 120. The encapsulated layer 510 is substantially similar to the first encapsulated layer 110, as discussed above, however, the encapsulated layer 510 includes both the first die 130 and an additional die 520. The additional die 520 may be configured to electrically connect to the first die 130, the second die 140, the solder balls 150, and/or the external interface layer 160 by way of the first interconnect layer, as discussed above.

It will be apparent to those skilled in the relevant art that in other embodiments of the present disclosure, the additional die 520 may be encapsulated within another layer of the IC package 100, 400, or 500 (e.g., the second layer 120 or the third layer 310). Furthermore, it will be apparent to those skilled in the relevant art that in other embodiments of the present disclosure, one or more layers of the IC package 100, 400, or 500 may include multiple dies.

Exemplary IC Packages with Dielectric Layer

FIG. 6 illustrates a cross-sectional view of a 3D IC chip package according to embodiments of the disclosure. As shown by FIG. 6, IC package 600 includes a dielectric layer 610 to provide an additional layer for routing a signal or communication. As shown by FIG. 6, the dielectric layer 610 is arranged between the solder balls 150 and the first encapsulated layer 110. The dielectric layer 610 includes a first dielectric interconnect layer 611, a second dielectric interconnect layer 612, and a dielectric material 613.

The first dielectric interconnect layer 611 is configured to provide an interface between the solder balls 150 and upper level components. The second dielectric interconnect layer 612 bonds to the first interconnect layer 611 to provide an electrical connection path between the first dielectric interconnect layer 611 and the upper level components. The second dielectric interconnect layer 612 is configured to connect to the I/O pads 111 and/or the contact pads 112. The first dielectric interconnect layer 611 and the second dielectric interconnect layer 612 can be formed of a conductive material(s) such as silver, copper, gold, or aluminum.

Dielectric material 613 encapsulates the first and second dielectric layers 611, 612 and forms the surfaces of the dielectric layer 610. The dielectric material 613 may be formed of such material as a polymer dielectric, an epoxy film such as an Ajinomoto a build-up film (ABF), a mold compound, a silicon nitride, or a silicon oxide.

A bottom or first surface 614 of the dielectric material 613 functions as the bottom surface of the IC package 600 and is configured to expose the first dielectric interconnect layer 611 for connecting to the solder balls 150. The top or second surface 615 of the dielectric material 613 bonds to the first surface 117 of the first encapsulated layer 110 and connects the second dielectric interconnect layer 612 to the first interconnect layer of the first encapsulated layer 110. The dielectric layer 610 provides additional spacing and routing to allow a configuration of the solder balls 150 below the area of the active surface 131 of the first die 130. Accordingly, the dielectric layer 610 may provide more direct electrical connection routing between the first die 130 and an external component or a PCB.

During a manufacturing process of the embodiment shown by FIG. 6, the dielectric layer 610 can be formed prior to the step 2 described above. In other words, during manufacturing of the IC package 600, the dielectric layer 610 is formed on the surface of the carrier 310 and then steps 2-5 are performed to form the first encapsulated layer 110 on the second surface 615 of the dielectric layer 610. More specifically, the first dielectric interconnect layer 611 is formed on the surface of the carrier 310 by using a plating process, physical vapor deposition (PVD), or chemical vapor deposition (CVD) process. Next, the second dielectric interconnect layer 612 is formed on a surface of the dielectric interconnect layer 611 by the plating process. The dielectric material 613 is then formed over the first and second dielectric interconnect layers 611, 612 to form the first and second surfaces 614, 615 of the dielectric layer 610, where the second surface 615 provides a base for the first encapsulated layer 110. A removal process and/or planarization process, such as grinding, polishing, etching, or chemical removal, may be performed as needed to expose the second dielectric interconnect layer 612 for connection with encapsulated layers. Then steps 2-5 of the manufacturing process, as described above, are performed, and repeated, to form multiple encapsulated layers.

FIG. 7 illustrates a cross-sectional view of a 3D IC chip package according to embodiments of the disclosure. As shown by FIG. 7, IC package 700 includes the dielectric layer 710 arranged between two encapsulated layers. In this case, the dielectric layer 710 provides additional routing between the first encapsulated layer 110 and the second encapsulated layer 120 for signals within the IC package 700. In this embodiment, the first surface 714 of the dielectric layer 710 is formed on the second surface 118 of the first encapsulated layer 110 such that the first dielectric interconnect layer 711 contacts the vertical vias 114. The second surface 715 of the dielectric layer 710 forms a base layer on which the second encapsulated layer 120 is formed and the second dielectric interconnect layer 712 contacts the second interconnect layer of the second encapsulated layer 120. In particular, the second dielectric interconnect layer 712 contacts the via pads 121 and/or the contact pads 122 of the second encapsulated layer 120.

During a manufacturing process of the embodiment shown by FIG. 7, the dielectric layer 710 may be formed after at least one of the encapsulated layers (e.g., the first encapsulated layer 110) has been formed. For example, during the manufacturing of the IC package 700, shown by FIG. 7, steps 1-5 are performed, as discussed above to form a first encapsulated layer 110. Next, the first dielectric interconnect layer 711 is formed on the second surface 118 of the first encapsulated layer 110 by a plating process. Next, the second dielectric interconnect layer 712 is formed on a surface of the dielectric interconnect layer 711 by the plating process, followed by the dielectric material 713 being formed over the first and second dielectric interconnect layers 711, 712 to form the dielectric layer 710. A removal process and/or planarization process, such as grinding, polishing, etching, or chemical removal, may be performed as needed to expose the second dielectric interconnect layer 712 for connection with encapsulated layers. As discussed, the dielectric layer 710 forms a base for the second encapsulated layer 120. After, steps 2-5 of the manufacturing process, as described above, are repeated to form the second encapsulated layer 120.

Exemplary IC Packages Having an Active Surface Facing Up

In an embodiment, an active surface of an IC die may face a top or second surface of an encapsulated layer of an IC package. For example, FIG. 8 illustrates another embodiment of a 3D IC package according to embodiments of the disclosure. In detail, FIG. 8 illustrates the IC package 800 having the first encapsulated layer 110, an encapsulated layer 810, solder balls 150, and external interface layer 160. The encapsulated layer 810 includes via pads 811, vertical vias 814, encapsulating material 815, and an IC die 820. The via pads 811 provide a conductive interface between lower layer components and upper layer components, and the vertical vias 814 provide an electrical connection path between the via pads 811 and upper layers of the IC package 800 (e.g., the external interface layer 160), and are formed similar to via pads 121 and vertical vias 124, as described above. The encapsulating material 815 encapsulates the IC die 820 to provide protection from the environment, and is formed similar to the encapsulating material 125, as described above. The IC die 820 has an active surface 821 that is directed towards a second surface 818 of the encapsulated layer 810. The active surface 821 of the IC die 820 connects to the external interface layer 160 by way of die connections 816. In this case, die connection 816 may include conductive pillars. A back surface 822 of the IC die 820 is mounted on the second surface 118 of the first encapsulated layer 110.

During manufacturing of the IC package 800, steps 1-5 are performed, as discussed above. The encapsulated layer 810 is formed on the second surface 118 of the first encapsulated layer 110. In detail, the via pads 811 are formed on the second surface 118 by a plating method or metal deposition method, similar to the formation of the via pads 121, and are arranged according to the connection needs and functions of the IC package 800. Next, the vertical vias 814 are formed on surfaces of the via pads 811, similar to the formation of the vertical vias 124, as shown by FIG. 8, and the back surface 822 of the IC die 820 is mounted on the second surface 118 of the first encapsulated layer 110 by way of an adhesive material. The die connections 816 are then bonded to corresponding bonding pads of the active surface 821 of the IC die 820. The die connections 816 may be bonded during a reflow process. The encapsulating material 815 is then formed to protect the IC die 820 and other portions of the encapsulated layer 810 and to form a base on which the external interface layer 160 is formed, in step 6, as discussed above. Prior to the external interface layer 160 being added, a removal process and/or planarization process, such as grinding, polishing, etching, or chemical removal, may be performed on the encapsulating material 815 to expose the vertical vias 814.

It will be apparent to those skilled in the relevant art that in other embodiments of the present disclosure, the die connections 816 and the vertical vias 814 may be exposed to the environment, for example, when the IC package 800 is manufactured without the external interface layer 160.

By directing the active surface 821 of the IC die 820 towards the second surface 818 of the encapsulated layer 810, electrical connection paths between the IC die 820 and an external component (not shown) are substantially reduced in length. Further, the size of the encapsulated layer 810 and the overall size of the IC package 800 may be reduced.

FIG. 9 illustrates another embodiment of a 3D IC package according to embodiments of the disclosure. As shown by FIG. 9, an active surface of an IC die may face an active surface of another IC die. For example, FIG. 9 illustrates an IC package 900 that includes a first encapsulated layer 910, the dielectric layer 710, and the second encapsulated layer 120. The first encapsulated layer 910 includes the I/O pads 911, thermal pads 912, vertical vias 914, an IC die 920, die connectors 916, and an encapsulating material 915. The I/O pads 911 provide a conductive interface for the IC package 900 to attach to other components such as a PCB (not shown) and are formed similar to the I/O pads 111, as described above. The thermal pads 912 provide a thermal interface between the back surface 922 of the IC die 820 and thermal balls 930. Accordingly, increased heat dissipation from the IC die 920 may occur as compared to IC packages that do not include thermal pads 912. The thermal balls 930 provide a conductive path for heat dissipation between the 3D IC package 900 and a PCB (not shown). Further, the thermal balls 930 are configured to facilitate connection between the IC package 900 and a PCB (not shown) and are formed of similar material as the solder balls 150, as described above. The vertical vias 914 provide an electrical connection path from the I/O pads 911 to other layers of the IC package 100, and/or components external to the IC package 100. The I/O pads 911, the thermal pads 912, and the vertical vias 914 are made of conductive materials such as silver, copper, gold, or aluminum.

The active surface 921 of the IC die 920 is configured to face the first surface 714 of the dielectric layer 710 to minimize an electrical connection between the IC die 920 and the second die 120. In detail, the active surface 921 of the IC die 920 bonds to the die connections 916. The first dielectric interconnect layer 711 is connected to the die connections 916. Accordingly, the dielectric layer 710, which is formed between the encapsulated layer 910 and the second encapsulated layer 120, provides a minimized connection path and interface between the IC die 920 and the second die 120.

During the manufacturing of the IC package 900, the encapsulated layer 910 is formed on a carrier (e.g., carrier 310). The I/O pads 111 and thermal pads 912 are formed on the carrier by a plating method. Next, the vertical vias 914 are formed on the I/O pads 911 and the back surface 922 of the IC die 920 is mounted on the thermal pads 912 by an adhesive. The die connections 916, which may include conductive pillars, are then bonded to corresponding bonding pads of the active surface 921 of the IC die 920. The die connections may be bonded during a reflow process. The encapsulating material 915 is then formed to protect the IC die 920 and other portions of the encapsulated layer 910, similar to the formation of the encapsulating material 115, as described above, and forms the first and second surfaces 917, 918 of the encapsulated layer 910. Further, a removal process and/or planarization process, such as grinding, polishing, etching, or chemical removal, may be performed on the encapsulating material 915 to expose the vertical vias 914 of the encapsulated layer 910, and form a base on which the dielectric layer 710 is formed, as discussed above. Following the formation of the encapsulate layer 910, the remaining layers (i.e., the dielectric layer 710 and the second encapsulated layer 120) are formed, as discussed above. Further, the external interface layer 160 and the solder balls 150 are attached, as discussed above, and the thermal balls 930 are attached similar to the solder balls 150.

In other embodiments, the solder balls 150, the external interface layer 160, and/or the thermal balls 930 may be omitted during a manufacturing process of the IC package 900.

Exemplary IC Package with a Conductor Plane

FIG. 10 illustrates another embodiment of a 3D IC package according to embodiments of the disclosure. As illustrated by FIG. 10, an IC package 1000 can include a conductor plane 1010. For example, the IC package 1000 includes the first encapsulated layer 110, the second encapsulated layer 120, the solder balls 150, and a conductor plane 1010. The conductor plane 1010 is configured to dissipate heat from the IC package 1000 or to provide a ground for the IC package 1000. The conductor plane 1010 mounts on the second surface 128 of the second encapsulated layer 120 and electrically connects to the vertical vias 124. The conductor plane 910 may be formed of a conductive material such as copper or aluminum and may include forms such as solid or mesh forms.

During manufacturing, the conductor plane 1010 can be formed on the second surface 128 of the second layer 120 after the formation of the second layer 120.

FIGS. 11A-11B illustrates other embodiments of a 3D IC package according to embodiments of the disclosure. As shown by FIGS. 11A-11B, an IC package 1100 may include conformal shielding 1110. The conformal shielding 1110 shields the IC package 1100 from unintended radiation and protects the IC package 1100 from the environment. The conformal shielding 1110 wraps around exterior surfaces of the IC Package 1100, as shown by FIG. 11A-11B. The conformal shielding 1110 can connect to the vertical vias 124 at the second surface 128 of the second encapsulated layer 120, as illustrated by FIG. 11A or the conformal shielding 1110 can connect to the IC package 1100 at the first interconnect layer of the first encapsulated layer 110 and/or the second interconnect layer of the second encapsulated layer 120 of the IC package 1110, as shown by FIG. 11B. The conformal shielding 1110 includes material that provides radiation protection to the IC package such as metal spray coating or a solid or mesh metal coating.

FIG. 12 illustrates another embodiment of a 3D IC package according to embodiments of the disclosure. As shown by FIG. 12, an IC package 1200 can include a heat spreader 1210 which contacts the top encapsulated layer of the IC package 1200. The heat spreader 1210 provides a way to dissipate heat away from the IC package 1200. The heat spreader 1210 may be formed of a conductive material such as copper or aluminum. The heat spreader 1210 attaches to the second surface 128 of the second encapsulating surface 120 by way of an adhesive 1220. During the manufacturing process, the heat spreader may be attached to an IC package after all repetitions of steps 2-5 have been completed.

CONCLUSION

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The foregoing disclosure outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) package, comprising:
 a first encapsulated layer, including:
  a first encapsulating material to form opposing first and second surfaces of the first encapsulated layer;
  one or more first dies encapsulated by the first encapsulating material; and
  a first interconnect layer to provide an electrical interface for the one or more first dies, the first interconnect layer disposed within the first encapsulating material and connected to the first surface of the first encapsulating layer; and
 a second encapsulated layer, including:
  a second encapsulating material to form opposing first and second surfaces of the second encapsulated layer, the first surface of the second encapsulated layer disposed directly on the second surface of the first encapsulated layer;
  one or more second dies encapsulated by the second encapsulating material; and
  a second interconnect layer to provide an electrical interface for the one or more second dies, the second interconnect layer disposed within the second encapsulating material and exposed to and contacting the second surface of the first encapsulated layer.

2. The IC package of claim 1, wherein the first encapsulated layer further comprises first vertical vias configured to provide an electrical path between the first interconnect layer and the second interconnect layer.

3. The IC package of claim 2, wherein the first interconnect layer comprises input/output (I/O) pads, first die contact pads, and traces configured to connect the I/O pads to the first die contact pads.

4. The IC package of claim 3, wherein the first vertical vias are configured to contact the I/O pads and via pads on the second interconnect layer.

5. The IC package of claim 3, wherein the first encapsulated layer further comprises first die connections configured to connect an active surface of the one or more first dies to the first die contact pads.

6. The IC package of claim 3, further comprising solder balls configured to electrically connect the I/O pads to a printed circuit board (PCB).

7. The IC package of claim 2, wherein the second encapsulated layer further comprises second vertical vias configured to provide an electrical path between the second interconnect layer and a component external to the IC package.

8. The IC package of claim 7, wherein the second interconnect layer comprises via pads, second die contact pads, and traces configured to connect the via pads to the second die contact pads.

9. The IC package of claim 8, wherein the second vertical vias are configured to contact the via pads and are exposed at the second interconnect layer.

10. The IC package of claim 9, further comprising an external interconnect layer to provide an electrical interface between the IC package and the component external to the IC package, wherein the external interconnect layer is disposed on the second surface of the second encapsulated layer.

11. The IC package of claim 8, wherein the second interconnect layer further comprises second die connections configured to connect the one or more second dies to the second die contact pads.

12. The IC package of claim 1, further comprising one or more additional encapsulated layers, wherein each of the one or more additional encapsulated layers comprises:
 an encapsulating material to form opposing first and second surfaces of the one or more additional encapsulated layers, the first surface of the one or more additional encapsulated layers disposed on a predetermined surface of a preceding encapsulated layer;

one or more dies encapsulated by the encapsulating material; and an interconnect layer to provide an electrical interface for the one or more dies, the interconnect layer disposed within the encapsulating material and exposed to and contacting the predetermined surface of the preceding encapsulated layer.

\* \* \* \* \*